(12) United States Patent
Xiao et al.

(10) Patent No.: US 10,928,565 B2
(45) Date of Patent: Feb. 23, 2021

(54) COLOR FILM SUBSTRATE, FABRICATING METHOD THEREFOR, DISPLAY PANEL AND DISPLAY DEVICE

(71) Applicants: BOE TECHNOLOGY GROUP CO., LTD., Beijing (CN); Beijing BOE Display Technology Co., Ltd., Beijing (CN)

(72) Inventors: Yu Xiao, Beijing (CN); Guohua Zhang, Beijing (CN); Dong Wang, Beijing (CN); Yongzhi Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 112 days.

(21) Appl. No.: 15/991,213

(22) Filed: May 29, 2018

(65) Prior Publication Data
US 2019/0165047 A1  May 30, 2019

(30) Foreign Application Priority Data
Nov. 30, 2017 (CN) .......................... 201711232488.0

(51) Int. Cl.
*G02B 5/20* (2006.01)
*G02B 5/22* (2006.01)
(Continued)

(52) U.S. Cl.
CPC ............ *G02B 5/201* (2013.01); *G02B 5/223* (2013.01); *G03C 7/06* (2013.01); *G03F 7/0007* (2013.01);
(Continued)

(58) Field of Classification Search
CPC ............. H01L 51/5284; H01L 27/3211; H01L 27/322; H01L 27/3246; H01L 51/525;
(Continued)

(56) References Cited

U.S. PATENT DOCUMENTS

2008/0123030 A1* 5/2008 Song ................... G02F 1/13394
349/110
2015/0205142 A1* 7/2015 Kim ....................... G02B 27/26
349/15

(Continued)

FOREIGN PATENT DOCUMENTS

CN         104880879 A      9/2015
CN         105097878 A     11/2015
(Continued)

OTHER PUBLICATIONS

First Office Action for Chinese Patent Application No. 201711232488.0 dated Dec. 17, 2018.

*Primary Examiner* — Jade R Chwasz
(74) *Attorney, Agent, or Firm* — Calfee, Halter & Griswold LLP

(57) ABSTRACT

The disclosure discloses a color film substrate, a fabricating method therefor, a display panel and a display device. The color film substrate includes: a first base substrate and a color layer disposed on the first base substrate, the color layer includes a plurality of color blockers having gaps therebetween; and a light-blocking spacer layer which includes a plurality of light-blocking spacers respectively disposed between the plurality of color blockers.

4 Claims, 2 Drawing Sheets

(51) Int. Cl.
*H01L 27/32* (2006.01)
*H01L 51/52* (2006.01)
*G03C 7/06* (2006.01)
*G03F 7/027* (2006.01)
*G03F 7/00* (2006.01)

(52) U.S. Cl.
CPC ............ *G03F 7/027* (2013.01); *H01L 27/322* (2013.01); *H01L 27/3246* (2013.01); *H01L 51/5284* (2013.01)

(58) Field of Classification Search
CPC ....... H01L 27/3241; G02B 5/201; G02B 5/20; G02B 5/223; G02F 1/133514; G02F 1/133512; G02F 1/13394; G02F 1/134309; G02F 1/136209; G03F 7/0007; G03F 7/027; G03C 7/06
USPC .......................................... 359/891, 885, 892
See application file for complete search history.

(56) References Cited

U.S. PATENT DOCUMENTS

2015/0331161 A1   11/2015  Wang
2016/0357042 A1*  12/2016  Yoon .................. G02F 1/133512
2016/0370649 A1*  12/2016  Zhang ..................... G02B 5/201

FOREIGN PATENT DOCUMENTS

| CN | 105118928 A | 12/2015 | |
|---|---|---|---|
| CN | 106226960 A | 12/2016 | |
| KR | 2006079709 A | * 7/2006 | ........... G02F 1/1335 |

* cited by examiner

COLOR FILM SUBSTRATE, FABRICATING METHOD THEREFOR, DISPLAY PANEL AND DISPLAY DEVICE

CROSS REFERENCE

The present disclosure claims priority to Chinese Patent Application No. 201711232488.0, filed on Nov. 30, 2017, and the entire contents thereof are incorporated herein by reference.

TECHNICAL FIELD

The present disclosure relates to the technical field of display, and in particular, to a color film substrate, a method for fabricating the same, a display panel, and a display device.

BACKGROUND

With the development of flat display technologies, the organic light-emitting diode (OLED) display technology has been being gradually emerged, which has advantages of self-luminescence, wide viewing angle, short reaction time, wide color gamut, thin panel, and simple process.

At present, there is a method for color display by means of a color filtering film in the OLED colorization technology. According to one embodiment of the present disclosure, the method includes: providing an OLED device on an array substrate, wherein the OLED device includes light emitting units separated by a pixel defining layer. The light emitting unit in each sub-pixel region corresponds to one color in the color layer on the color film substrate. A transparent planar layer is formed on the color film substrate, and a transparent spacer layer is disposed between the planar layer and the pixel defining layer. The spacer layer separates adjacent sub-pixel regions. The light emitting units of the OLED device emit white light which illuminates the color layer corresponding to the light emitting unit, thereby realizing colorization.

However, when the light emitting units emit white light toward the color layer, during the propagation of the white light, the scattered light of the white light may pass through the transparent spacer layer and the planar layer into adjacent sub-pixel regions, and exits from the adjacent sub-pixel areas, resulting in color mixing.

SUMMARY

According to one aspect of the present disclosure, an embodiment of the present disclosure provides a color film substrate including:

a first base substrate and a color layer disposed on the first base substrate, the color layer includes a plurality of color blockers having gaps therebetween; and a light-blocking spacer layer which includes a plurality of light-blocking spacers respectively disposed between the plurality of color blockers.

According to one embodiment of the present disclosure, the light-blocking spacers of the light-blocking spacer layer are black spacers.

According to one embodiment of the present disclosure, the light-blocking spacer layer is made of a photoresist which includes an acrylate and a black carbon pigment incorporated into the acrylate.

According to one embodiment of the present disclosure, the light-blocking spacers of the light-blocking spacer layer have a column structure.

According to one embodiment of the present disclosure, the light-blocking spacer of the light-blocking spacer layer comprises light-blocking portions respectively disposed between the plurality of color blockers, and protrusion portions which protrudes with respect to a side of the color layer away from the first base substrate and has a height of any value between 0.5 μm and 3 μm.

According to one embodiment of the present disclosure, the protrusion portion has a sectional shape of trapezoidal with a side thereof away from the color layer being a shorter bottom side.

According to one embodiment of the present disclosure, the light-blocking portion has a sectional shape of trapezoidal with a side thereof away from the color layer being a shorter bottom side.

In another aspect, an embodiment of the present disclosure further provides a method for fabricating a color film substrate, including:

forming a color layer on a first base substrate, wherein the color layer includes a plurality of color blockers having gaps therebetween; and forming a light-blocking spacer layer, wherein the light-blocking spacer layer includes a plurality of light-blocking spacers which are respectively located between the plurality of color blockers.

According to one embodiment of the present disclosure, the forming a light-blocking spacer layer includes:

applying a photoresist on the first base substrate formed with the color layer, wherein the photoresist includes an acrylate and a black carbon pigment incorporated into the acrylate; and exposing and developing the photoresist to form black spacers between respective adjacent color blockers.

In another aspect, an embodiment of the present disclosure further provides a display panel which includes a color film substrate and an array substrate cell-docked to each other, wherein the color film substrate includes:

a first base substrate and a color layer disposed on the first base substrate, the color layer includes a plurality of color blockers having gaps therebetween; and a light-blocking spacer layer which includes a plurality of light-blocking spacers respectively disposed between the plurality of color blockers;

wherein the array substrate includes a second base substrate which is provided thereon with a plurality of pixel defining layers and a plurality of light emitting units separated by the pixel defining layers, wherein each of the light emitting units corresponds to each of the color blockers of the color film substrate, and each of the pixel defining layers abuts against each of the light-blocking spacers of the color film substrate.

In another aspect, an embodiment of the present disclosure further provides a display device including the aforesaid display panel.

DETAILED DESCRIPTION

The present disclosure will be further described in detail below with reference to the accompanying drawings and embodiments.

Figure 1:
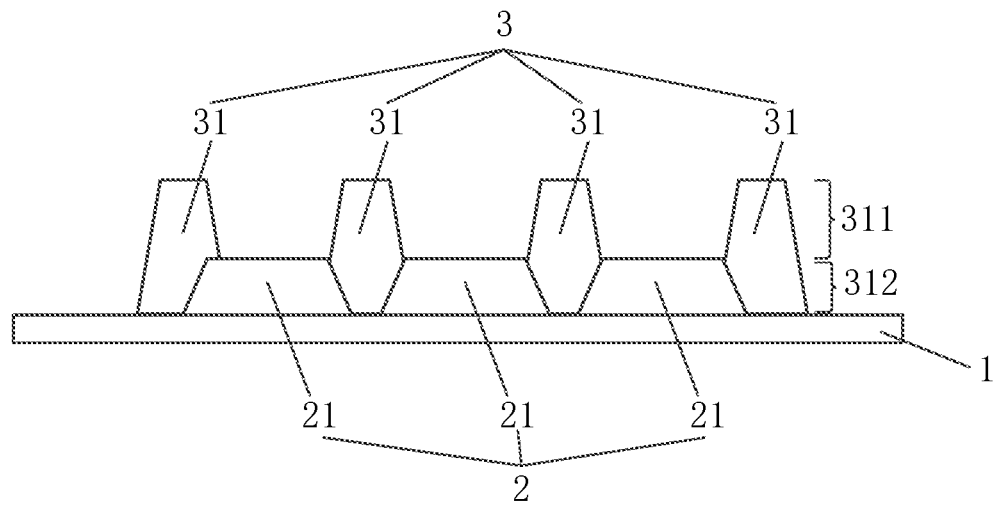
FIG. 1 is a schematic structural view of a color film substrate according to an embodiment of the present disclosure.

As shown in FIG. 1, an embodiment of the present disclosure provides a color film substrate including: a first base substrate 1 and a color layer 2 disposed on the first base substrate 1, the color layer 2 including a plurality of color blockers 21 having gaps therebetween; a light-blocking spacer layer 3 which includes a plurality of light-blocking spacers 31, and the plurality of light-blocking spacers 31 being respectively disposed between the plurality of color blockers 21.

Here, the color layer 2 provided on the first base substrate 1 is usually formed by a photolithography process by applying three color photoresists of red (R), green (G) and blue (B) on the first base substrate 1, and performing exposure and development processes to produce patterns for RGB color layers, each of the R color layer, G color layer and B color layer being a color block 21 having gaps therebetween. It should be noted that instead using the three primary colors of RGB as the colors of the color layer 2, other colors may also be used, such as the four primary colors of RGBW with W being white. The colors of the color layer 2 may be selected according to requirements, and are not limited herein.

Light-blocking spacers 31 are respectively disposed between respective adjacent color blockers 21. The light-blocking spacers 31 may be formed by a photolithography process, by applying the photoresist for spacers incorporated with light-blocking material on the first base substrate 1 on which the color layer 2 has been formed, and performing exposure and development processes to form a pattern of the light-blocking spacer layer 3, with the light-blocking spacers 31 separating the sub-pixel regions where the color blockers 21 are located from each other. The light-blocking spacer layer 3 plays roles of spacing and light blocking, and replaces the light shielding layer, the planar layer, and the spacer layer in the prior art.

Figure 2:
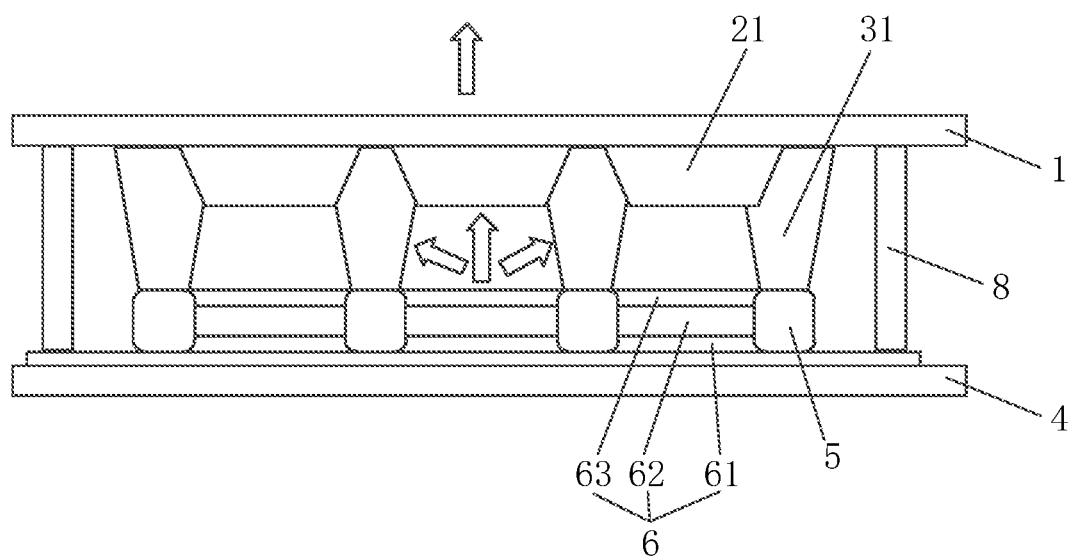
FIG. 2 is a schematic structural view of a display panel according to an embodiment of the present disclosure.

As shown in FIG. 2, the color film substrate and the OLED array substrate of the present embodiment are cell-docked to each other to form an OLED display panel. The second base substrate 4 of the OLED array substrate is provided thereon with a plurality of light emitting units 6 separated by the pixel defining layer 5. The light emitting unit 6 in each sub-pixel region corresponds to one color blocker 21. When the light emitting unit 6 in a sub-pixel region emits white light, the white light exits from the array substrate and travels towards the color blocker 21 corresponding to the light emitting unit 6, and then exits from the first base substrate 1, thereby emitting light of the color of the color block 21. Here, since the light-blocking spacers 31 have a light blocking effect, when the scattered light of the white light impinges on the light-blocking spacers 31, the scattered light will not enter adjacent sub-pixel regions through the light-blocking spacers 31. Accordingly, the light emitted from the sub-pixel regions does not enter the color blockers 21 in the adjacent sub-pixel regions, thereby avoiding the occurrence of color mixing and improving the display effect.

According to the color film substrate provided by the embodiment of the present disclosure, the sub-pixel regions are separated from each other by providing the light-blocking spacer layer which plays spacing and light blocking roles such that the light in each sub-pixel region does not enter the adjacent sub-pixel regions through the light-blocking spacers. According to one embodiment of the present disclosure, the color film substrate and the OLED array substrate are cell-docked to form an OLED display panel, and the light-emitting unit in a sub-pixel region on the array substrate emits white light which enters the color blocker corresponding to the light-emitting unit, and exiting from the first base substrate to display the color of the color-blocking block. During the propagation of the while light, when the scattered light of the white light illuminates the light-blocking spacers, the light-blocking spacers block the light from transmitting the surfaces thereof, preventing the scattered light of the white light from entering the color blockers in the adjacent sub-pixel regions and exiting from the first base substrate to cause color mixing, thereby improving the display effect. Moreover, the light-blocking spacer layer replaces the light-blocking layer, the planar layer and the spacer layer in the prior art, thereby reducing the processes and the cost.

According to one embodiment of the present disclosure, the light-blocking spacers 31 of the light-blocking spacer layer 3 are black spacers. The light-blocking spacers 31 are made black to absorb the light illuminated on the light-blocking spacers 31 and play a light blocking role. Here, the black color has a better light blocking effect than others.

According to one embodiment of the present disclosure, the light-blocking spacer layer 3 is made of a photoresist which includes an acrylate and a black carbon pigment incorporated into the acrylate. Acrylate is one of the main materials in the spacer material and plays a supporting role. In the acrylate is mixed the black pigment which is mainly carbon and acts to absorb light. The light-blocking spacer layer 3 is made of materials containing acrylic ester and black carbon pigment, and disposed between the first base substrate 1 and the array substrate, playing roles of supporting, pixel isolating and light blocking, and serving the functions of the light-blocking layer, the planar layer and the spacer layer in the prior art. The light-blocking spacer layer 3 is formed by a photolithography process so as to form a desired pixel pattern.

According to one embodiment of the present disclosure, the light-blocking spacers 31 of the light-blocking spacer layer 3 have a column structure. The column structure has a good supportability over other structures of shapes such as a spherical shape and can be more stably supported between the first base substrate 1 and the array substrate.

According to one embodiment of the present disclosure, the light-blocking spacer 31 of the light-blocking spacer layer 3 includes a protrusion portion 311 and a light-blocking portion 312. A plurality of the light-blocking portion respectively are disposed between the plurality of color blockers. The protrusion portion 311 protrudes with respect to a side of the color layer 2 away from the first base substrate 1, and having a thickness of any value between 0.5 µm and 3 µm. When designing the light-blocking spacer layer 3, considering that the light-blocking spacer layer 3 can play both a role of blocking light and a role of supporting, the thickness of the light-blocking spacer 31 of the light-blocking spacer layer 3 should not be too small, such that it may have sufficient support strength. Meanwhile, the thickness of the light-blocking spacer 31 should not be too large, in order to ensure that as the light emitted by the light-emitting unit 6 is propagating, its scattered light is reduced, and ensure a thin design of the display panel. Accordingly, it is preferable that the thickness of the light-blocking spacer 31 protruding with respect to the color layer 2 is of any value between 0.5 µm and 3 µm.

According to one embodiment of the present disclosure, the protrusion portion 311 has a sectional shape of trapezoidal with a side thereof away from the color layer 2 being the shorter bottom side. The light-blocking spacer layer 3 is formed on the first base substrate 1 on which the color layer 2 has been formed, and the light-blocking spacers 31 thereof are filled in the gaps of the color layer 2 and protrude from the color layer 2. The design in which sectional shape of the protrusion portion 311 with respect to the color layer 2 is trapezoidal has a strong supporting effect, a good effect, and a high supporting stability. The light-blocking portion 312 has a sectional shape of trapezoidal with a side thereof contacting the color layer 2 being the shorter bottom side.

According to the color film substrate provided by the embodiment of the present disclosure, the sub-pixel regions are separated from each other by providing the light-blocking spacer layer which plays spacing and light blocking roles such that the light in each sub-pixel region does not enter the adjacent sub-pixel regions through the light-blocking spacers. According to one embodiment of the present disclosure, the color film substrate and the OLED array substrate are cell-docked to form an OLED display panel, and the light-emitting unit in a sub-pixel region on the array substrate emits white light which impinges on the color blocker corresponding to the light-emitting unit, and exits from the first base substrate to display the color of the color-blocking block. During the propagation of the while light, when the scattered light of the while light illuminates the light-blocking spacers, the light-blocking spacers block the light from transmitting surfaces thereof, avoiding the scattered light of the white light from entering the color blockers in the adjacent sub-pixel regions and exiting from the first base substrate to cause color mixing, thereby improving the display effect. Moreover, the light-blocking spacer layer replaces the light-blocking layer, the planar layer and the spacer layer in the prior art, thereby reducing the processes and the cost.

Figure 3:
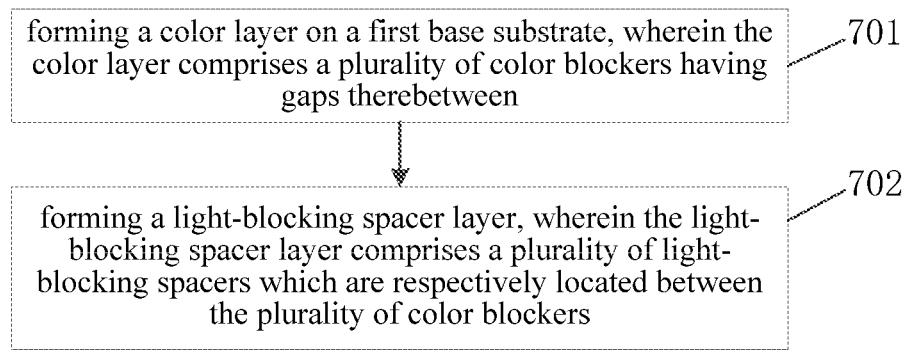
FIG. 3 is a flowchart of a method for fabricating a color film substrate according to an embodiment of the present disclosure.

As shown in FIG. 3, an embodiment of the present disclosure provides a method for fabricating a color film substrate, including steps 701 and 702.

In step 701, a color layer is formed on the first base substrate, wherein the color layer includes a plurality of color blockers having gaps therebetween.

Figure 4:
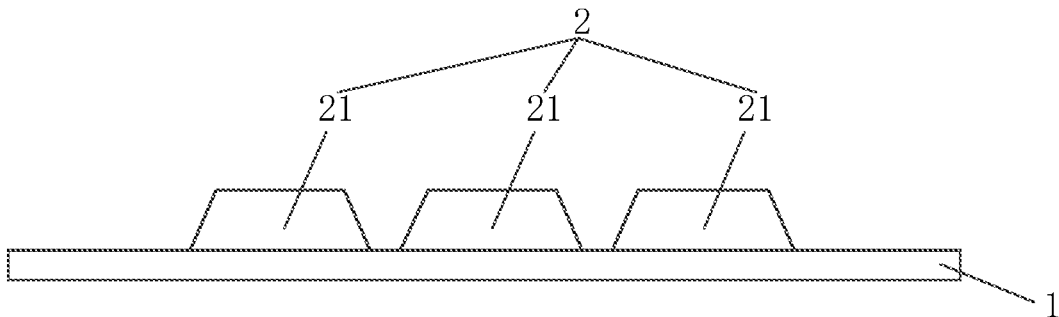
FIG. 4 is a schematic view of a structure after have performing a first step of the method for fabricating a color film substrate according to an embodiment of the present disclosure.

Referring to FIG. 4, the color layer 2 is generally an RGB color layer, wherein the R color layer, the G color layer, and the B color layer are color blockers 21, respectively. For an example that the color layer 2 is an RGB color layer, on the first substrate is applied in subsequence three color photoresists of RGB, and the exposure and development processes are performed to produce patterns for RGB color layers. Here, the specific operation methods of application, exposure, and development are the same as those in the prior art, and are not repeated herein.

In step 702, a light-blocking spacer layer is formed.

Referring to FIG. 1, the light-blocking spacer layer 3 includes a plurality of light-blocking spacers 31 which are respectively located between the plurality of color blockers 21.

Figure 5:
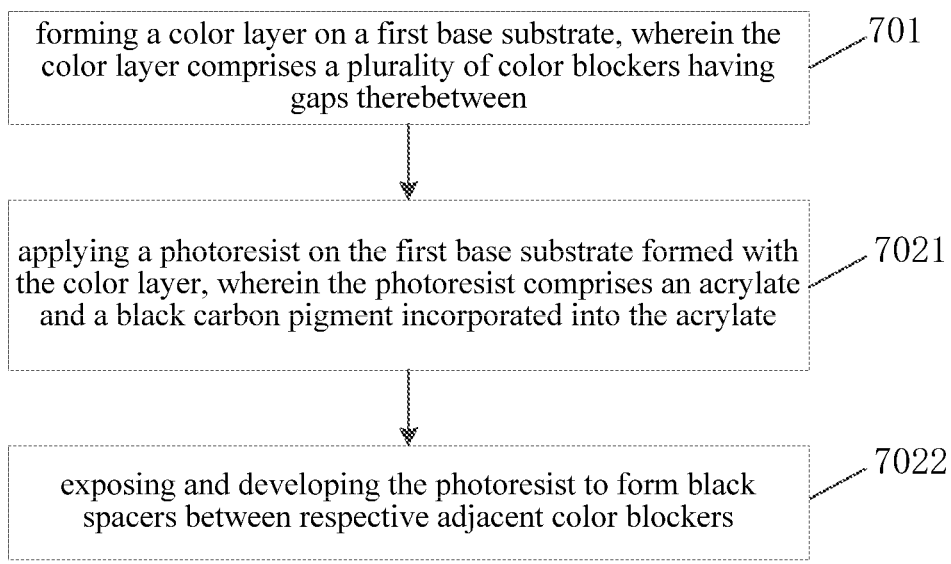
FIG. 5 is a flowchart of another method for fabricating a color film substrate according to an embodiment of the present disclosure.

The light-blocking spacer layer 3 separates the sub-pixel regions where the plurality of color blockers 21 are located from each other, and plays spacing and light blocking roles, and is used to replace the light-blocking layer and the planar layer and the spacer layer in the prior art. Referring to FIG. 5, a specific method for forming the light-blocking spacer layer may be as follows:

In step 7021, a photoresist is applied on the first base substrate on which the color layer has been formed, wherein the photoresist includes an acrylate and a black carbon pigment incorporated into the acrylate.

Acrylic ester is one of the main materials in the spacer material, and is mixed with black carbon pigment, which has both the supporting function and the function of absorbing light. The photoresist is applied on the first base substrate formed with the color layer such that the photoresist fills the gaps of the full-color layer and completely covers the color layer. Then proceed to step 7022.

In step 7022, the photoresist is exposed and developed to form black spacers between respective adjacent color blockers.

Through the exposure and development processes, the photoresist that does not need to be patterned is removed to form a structure as shown in FIG. 1 such that black spacers 31 are formed between respective adjacent color blockers 21 and separate the sub-pixel regions from each other. The formed black spacer layer 3 has the function of supporting and blocking light, thereby eliminating the need to separately fabricate the light-blocking layer, the planar layer, and the spacer layer, and saving costs.

According to the method for fabricating a color film substrate provided by the embodiment of the present disclosure, the sub-pixel regions are separated from each other by providing the light-blocking spacer layer which plays spacing and light blocking roles such that the light in each sub-pixel region does not enter adjacent sub-pixel regions through the light-blocking spacers. According to one embodiment of the present disclosure, the color film substrate and the OLED array substrate are cell-docked to form an OLED display panel. The light emitting unit in a sub-pixel region on the array substrate emits white light to impinge on the color blocker corresponding to the light emitting unit and exits from the first base substrate to display the color of the color blocker. During the propagation of the white light, the scattered light of the white light illuminates the light-blocking spacers which block it from transmitting the surfaces thereof, thereby preventing the scattered light of the white light from entering the color blockers of adjacent sub-pixel regions and exiting from the first base substrate to cause color mixing, thereby improving the display effect. In addition, the light-blocking spacer layer replaces the light-blocking layer, the planar layer, and the spacer layer in the prior art, thereby reducing the processes and the cost.

As shown in FIG. 2, an embodiment of the present disclosure provides a display panel including a color film substrate and an array substrate which are cell-docked to each other. The color film substrate is the color film substrate described above. The array substrate includes a second base substrate 4 which is provided thereon with a plurality of pixel defining layers 5 and a plurality of light emitting units 6 separated by the pixel defining layers 5. Each light emitting unit 6 corresponds to each color blocker 21 of the color film substrate, and each pixel defining layer 5 abuts against each light-blocking spacer 31 of the color film substrate.

The display panel may be an OLED display panel, and is formed by cell-docking the color film substrate and the array substrate and being fixed by a frame sealant 8. The light emitting unit 6 in each sub-pixel region on the array substrate corresponds to a color blocker 21. When the light emitting unit 6 in a sub-pixel region emits white light, the white light travels towards the color blocker 21 corresponding to the light emitting unit 6. Here, the scattered light of the white light may impinge on the light-blocking spacers 31 which can block the scattered light from passing therethrough, thereby blocking the scattered light of the white light from entering the color blockers 21 in the adjacent sub-pixel regions and avoiding color mixing. Here, the structure of the color film substrate and the working principle of avoiding color mixing are the same as those in the foregoing embodiment, and are not repeated here again.

Here, the light emitting unit 6 includes an anode layer 61, an organic light emitting layer 62, and a cathode layer 63 which are sequentially disposed on the second base substrate 4. The anode layer 61, the organic light-emitting layer 62, and the cathode layer 63 may be respectively patterned by an application process, an exposure process, a development process, and an etching process. The specific process method is the same as the method for fabricating the OLED array substrate in the prior art, and details are not repeated herein.

According to the embodiment of the present disclosure, the display panel is formed by cell-docking the color film substrate and the array substrate together. The light emitting unit in a sub-pixel region on the array substrate emits white light to impinge on the color blocker corresponding to the light emitting unit and exits from the first base substrate to display the color of the color blocker. During the propagation of the white light, the scattered light of the white light illuminates the light-blocking spacers which play roles of spacing and light-blocking between adjacent sub-pixel regions and block the scattered light of the white light from entering the adjacent sub-pixel regions through the light-blocking spacers, thereby avoiding occurrence of color mixing and improving the display effect. In addition, the light-blocking spacer layer replaces the light-blocking layer, the planar layer, and the spacer layer in the prior art, thereby reducing the processes and cost.

An embodiment of the present disclosure provides a display device including the aforesaid display panel.

Here, the structure and working principle of the display panel are the same as those in the above embodiments, and will not be repeated here.

A display device provided by an embodiment of the present disclosure includes a display panel formed by cell-docking a color film substrate and an array substrate together, wherein a first base substrate of the color film substrate is provided with a light-blocking spacer layer for separating the sub-pixel regions from each other. The light-blocking spacer layer plays roles of spacing and light-blocking. When a light emitting unit in a sub-pixel region on the array substrate emits white light, the white light travels towards the color blocker corresponding to the light emitting unit and exits from the first base substrate to display the color of the color blocker. The scattered light of the white light may impinge on the light-blocking spacers which play roles of spacing and light-blocking between adjacent sub-pixel regions and block the scattered light of the white light from entering the adjacent sub-pixel regions through the light-blocking spacers, thereby avoiding occurrence of color mixing and improving the display effect. In addition, the light-blocking spacer layer replaces the light-blocking layer, the planar layer, and the spacer layer in the prior art, thereby reducing the processes and cost.

The foregoing descriptions are merely specific implementation manners of the present disclosure. The protection scope of the present disclosure, however, is not limited thereto. Those skilled in the art can easily think of changes or replacements within the technical scope disclosed by the present disclosure which should be covered by the protection scope of the present disclosure. Therefore, the protection scope of the present disclosure shall be based on the protection scope of the claims.

What is claimed is:

1. A display panel comprising a color film substrate and an array substrate cell-docked to each other, wherein the color film substrate comprises:
    a first base substrate,
    a color layer disposed on the first base substrate, wherein the color layer comprises a plurality of color blockers having gaps therebetween; and
    a light-blocking spacer layer comprising a plurality of light-blocking spacers respectively disposed between the plurality of color blockers;
    wherein a length of a surface of the light-blocking spacer facing the color blocker is larger than or equal to a length of a surface of the color blocker facing the light-blocking spacer, so as to avoid occurrence of color mixing,
    wherein the light-blocking spacers of the light-blocking spacer layer are black spacers,
    wherein each of the light-blocking spacers of the light-blocking spacer layer comprises a light-blocking portion and a protrusion portion, a plurality of the light-blocking portion respectively disposed between the plurality of color blockers, the protrusion portion protrudes with respect to a side of the color layer away from the first base substrate and has a height of any value between 0.5 μm and 3 μm,
    wherein the protrusion portion has a sectional shape of trapezoidal with a side thereof away from the color layer being a shorter bottom side,
    wherein the light-blocking portion has a sectional shape of trapezoidal with a side thereof contacting the color layer being a shorter bottom side,
    wherein the protrusion portion has a longer bottom side close to the color layer, the light-blocking portion has a longer bottom side away from the first base substrate, both of the longer bottom side of the protrusion portion and the longer bottom side of the light-blocking portion are common and have a same length,
    wherein the array substrate comprises a second base substrate provided thereon with a plurality of pixel defining layers and a plurality of light emitting units separated by the pixel defining layers, wherein each of the light emitting units corresponds to each of the color blockers of the color film substrate, and each of the pixel defining layers abuts against each of the light-blocking spacers of the color film substrate,
    wherein a maximum width of an orthographic projection of the light-blocking spacer on the first base substrate is equal to a maximum distance between adjacent ones of the color blockers.

2. The display panel according to claim 1, wherein the light-blocking spacers of the light-blocking spacer layer have a column structure.

3. A display device comprising the display panel according to claim 1.

4. The display panel according to claim 1, wherein the light-blocking spacer layer is made of a photoresist which comprises an acrylate and a black carbon pigment incorporated into the acrylate.

\* \* \* \* \*